(12) United States Patent
Du Pasquier

(10) Patent No.: US 9,164,141 B2
(45) Date of Patent: Oct. 20, 2015

(54) GEL PROBE PHOTOCURRENT MEASUREMENT DEVICE AND METHODS OF USE THEREOF

(75) Inventor: Aurelien L. Du Pasquier, Albuquerque, NM (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 578 days.

(21) Appl. No.: 13/419,975

(22) Filed: Mar. 14, 2012

(65) Prior Publication Data

US 2012/0242325 A1 Sep. 27, 2012

Related U.S. Application Data

(60) Provisional application No. 61/452,815, filed on Mar. 15, 2011.

(51) Int. Cl.
*G01R 31/00* (2006.01)
*G01R 31/26* (2014.01)
*H02S 50/10* (2014.01)
*C01G 3/02* (2006.01)

(52) U.S. Cl.
CPC .............. *G01R 31/2648* (2013.01); *C01G 3/02* (2013.01); *H02S 50/10* (2014.12); *C01P 2006/40* (2013.01)

(58) Field of Classification Search
CPC ................................. H02S 50/10; G01N 21/31
USPC ............ 324/761.01, 96; 702/182; 250/214 R
See application file for complete search history.

(56) References Cited

U.S. PATENT DOCUMENTS

| | | | |
|---|---|---|---|
| 5,800,350 A * | 9/1998 | Coppleson et al. ............ 600/372 |
| 2004/0095147 A1 * | 5/2004 | Cole .............................. 324/629 |
| 2005/0045851 A1 * | 3/2005 | He et al. .................... 252/62.3 R |
| 2005/0061364 A1 * | 3/2005 | Peumans et al. ............... 136/263 |
| 2011/0279810 A1 * | 11/2011 | Wang et al. ...................... 356/72 |

OTHER PUBLICATIONS

Chen, et al., Dye-Sensitized Solar Cells Combining ZnO Nanotip Arrays and Nonliquid Gel Electrolytes, Journal of Electronic Materials, vol. 38, No. 8, pp. 1612-1617, 2009.*
Du Pasquier, A., et al., "Cuprous Oxide Solution Preparation and Application to Cu2O-ZnO Solar Cells," ECS Transactions (2010) 28(4):179-190, Ref. Date: Apr. 25, 2010.
Duan, Z., et al., "Gel probe Photocurrent Measurement of Cuprous Oxide Films," Solar Energy Materials & Solar Cells (2010) 94:1741-1746.
Chen, H., et al., "Dye-sensitized Solar Cells Using ZnO Nanotips and Ga-doped ZnO Films," Semicon. Sci. Technol. (2008) 23:045004.
Chen, H., et al., "Dye-sensitized Solar Cells Combining ZnO Nanotips Arrays and Nonliquid Gel Electrolytes," J. Electron. Mater. (2009) 38(8):1612-1617.
Du Pasquier, A., "An Approach to Laminated Flexible Dye Sensitized Solar Cells," Electrochimica Acta (2007) 52:7469-7474.

* cited by examiner

*Primary Examiner* — Melissa Koval
*Assistant Examiner* — Daniel Miller
(74) *Attorney, Agent, or Firm* — Robert C. Netter, Jr.; Kathleen D. Rigaut; Dann, Dorfman, Herrell & Skillman

(57) ABSTRACT

Apparatus and methods of use thereof for the measurement of photocurrents are provided. More specifically, methods for measuring the external quantum efficiency of a sample are provided wherein the method comprises contacting a sample with an electrolyte gel; contacting the electrolyte gel with a probe; directing light on the sample through the probe; measuring the resultant photocurrent; and determining the external quantum efficiency based on the light input power and the measured photocurrent.

12 Claims, 20 Drawing Sheets

GEL PROBE PHOTOCURRENT MEASUREMENT DEVICE AND METHODS OF USE THEREOF

Figure 1A:
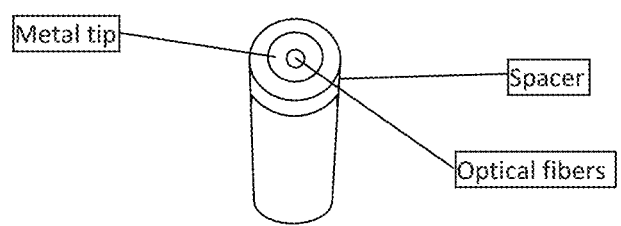

This application claims priority under 35 U.S.C. §119(e) to U.S. Provisional Patent Application No. 61/452,815, filed Mar. 15, 2011. The foregoing application is incorporated by reference herein.

FIELD OF THE INVENTION

This invention relates photocurrent measurements. More specifically, the instant invention provides gel probes for measuring photocurrents and methods of use thereof.

BACKGROUND OF THE INVENTION

The photocurrent action spectra or external quantum efficiency (EQE) measurement of semiconductor thin films is an important parameter for solar cell development. Values higher than 80% photon to electron conversion efficiency over a broad range of wavelengths are a necessary (but not sufficient) condition for the development of highly efficient solar cells. However, this measurement is usually performed on the actual solar cells, i.e., the knowledge occurs once the final device is assembled. It would be very desirable to gain such knowledge beforehand, by having a simple probe measurement of the photoactive semiconductor, as this would save cost and research time.

SUMMARY OF THE INVENTION

In accordance with one aspect of the instant invention, methods for measuring the photocurrent action spectra or external quantum efficiency of a sample are provided. In a particular embodiment, the method comprises contacting the sample with an electrolyte gel; contacting the electrolyte gel with a probe, particularly a fiber optic probe; directing a light beam (e.g., a chopped monochromatic light beam) on the sample via the probe; and measuring the resultant AC photocurrent. The external quantum efficiency may be determined based on the light input power. In a particular embodiment, the electrolyte gel is non-aqueous and comprises an electrolyte (e.g., $CuSO_4$), at least one polar solvent (e.g., NMP), and/or at least one polymer (e.g., PVDF-HFP). The method may further comprise amplifying the measured photocurrent.

According to another aspect of the instant invention, probes for measuring the photocurrent action spectra or external quantum efficiency of a sample are provided. In a particular embodiment, the probe comprises a) a means to deliver light to the sample (e.g., optical fibers), b) a metal tip (e.g., copper), and c) an insulator spacer (e.g., PTFE) which fixes the distance from the probe to a sample. The probe may further be connected to an amplifier, light source, and/or spectrometer. The instant invention also encompasses kits which comprise at least one probe and, optionally, at least one electrolyte gel.

BRIEF DESCRIPTIONS OF THE DRAWING

Figure 1B:
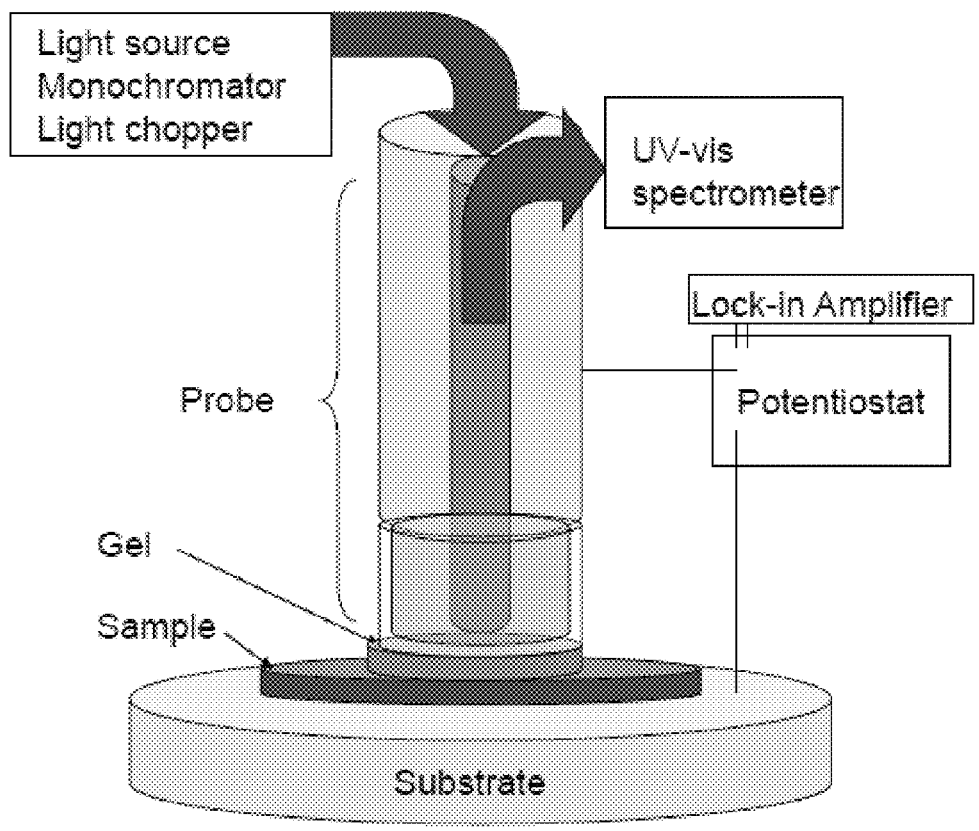

FIG. 1A provides a schematic of the photocurrent probe. FIG. 1B provides a schematic of the photocurrent probe and the configuration used to measure photocurrent on a $Cu_2O$ foil.

Figure 2:
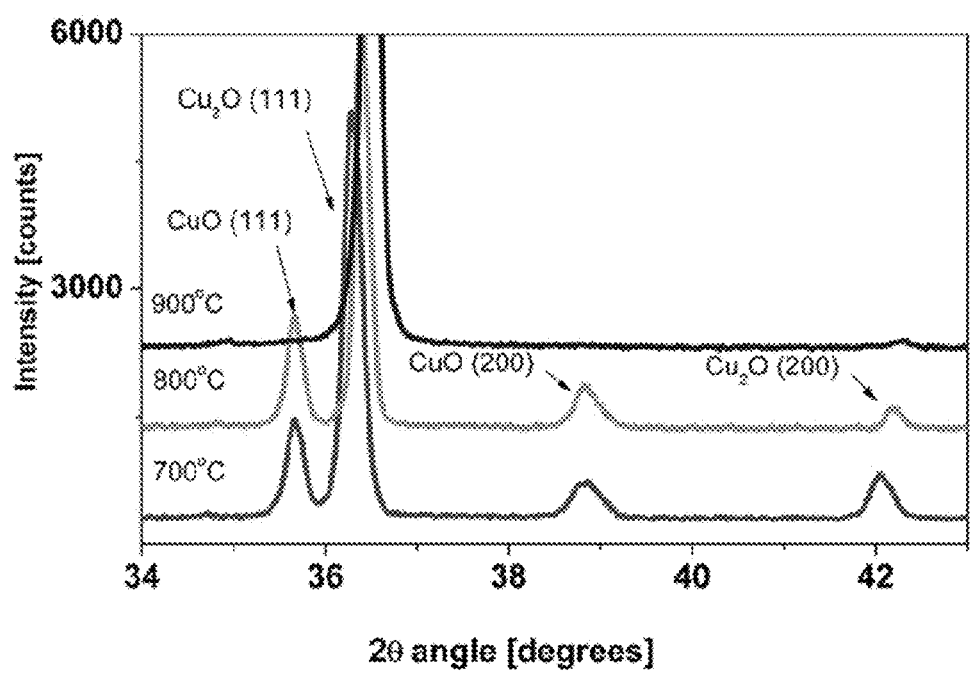

FIG. 2 provides X-ray diffractograms of the $Cu_2O/CuO$ phases grown for 10 minutes in air at 700, 800 and 900° C.

Figure 3:
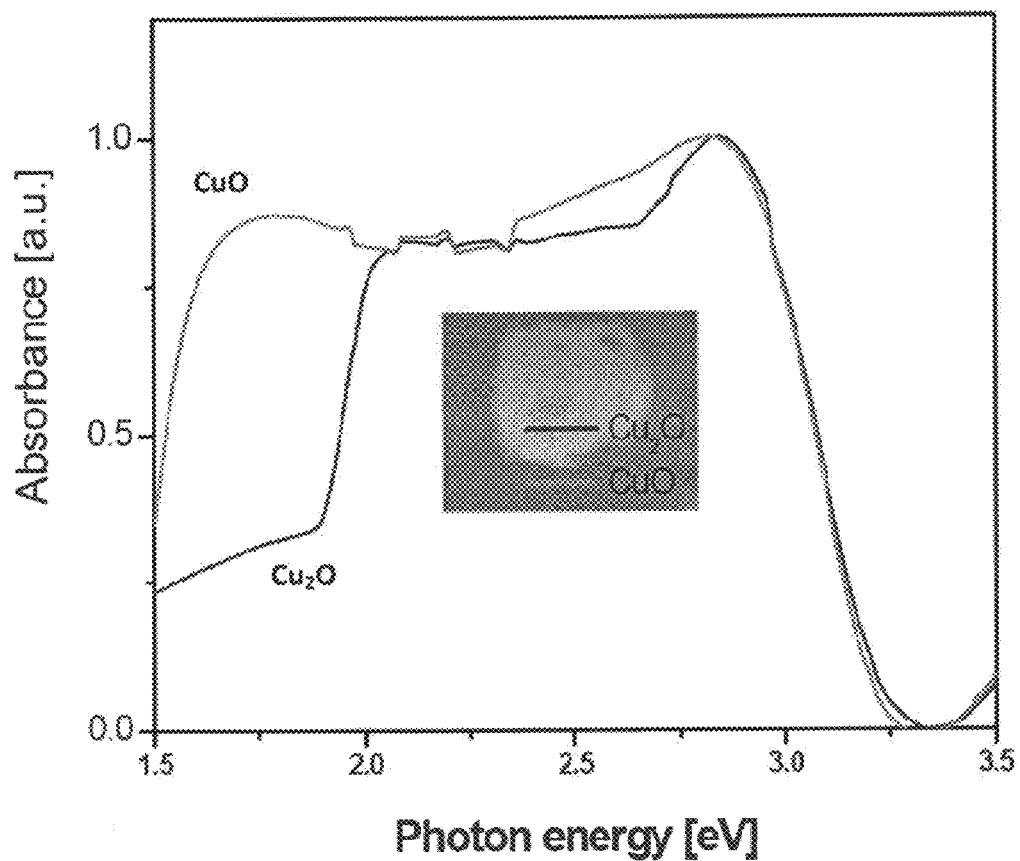

FIG. 3 provides UV-vis absorption spectra in reflection mode of the CuO and $Cu_2O$ phases grown at 900° C. Optical picture of the film shown in inset.

Figure 4:
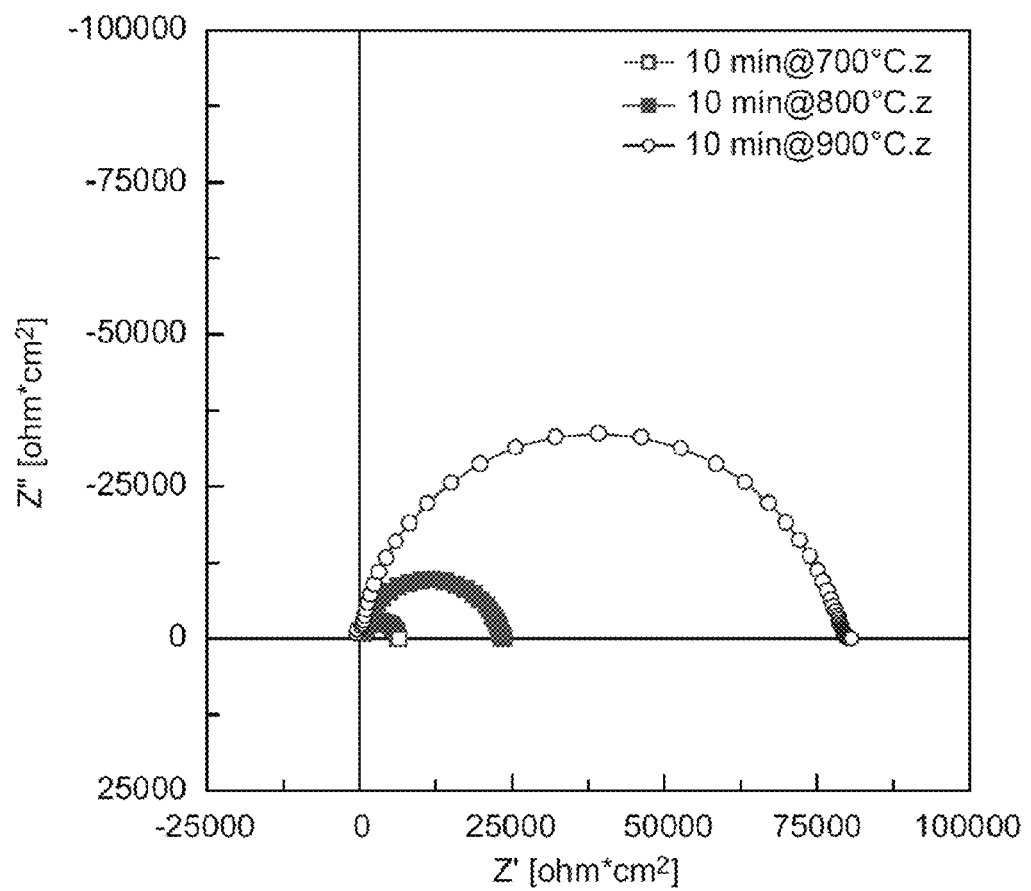

FIG. 4 provides a Nyquist plot of the $Cu_2O/CuO$ films grown at various temperatures, with (right) or without (left) GZO and ZnO-GZO coatings (1 MHz-0.1 Hz, 20 mV amplitude).

Figure 5:
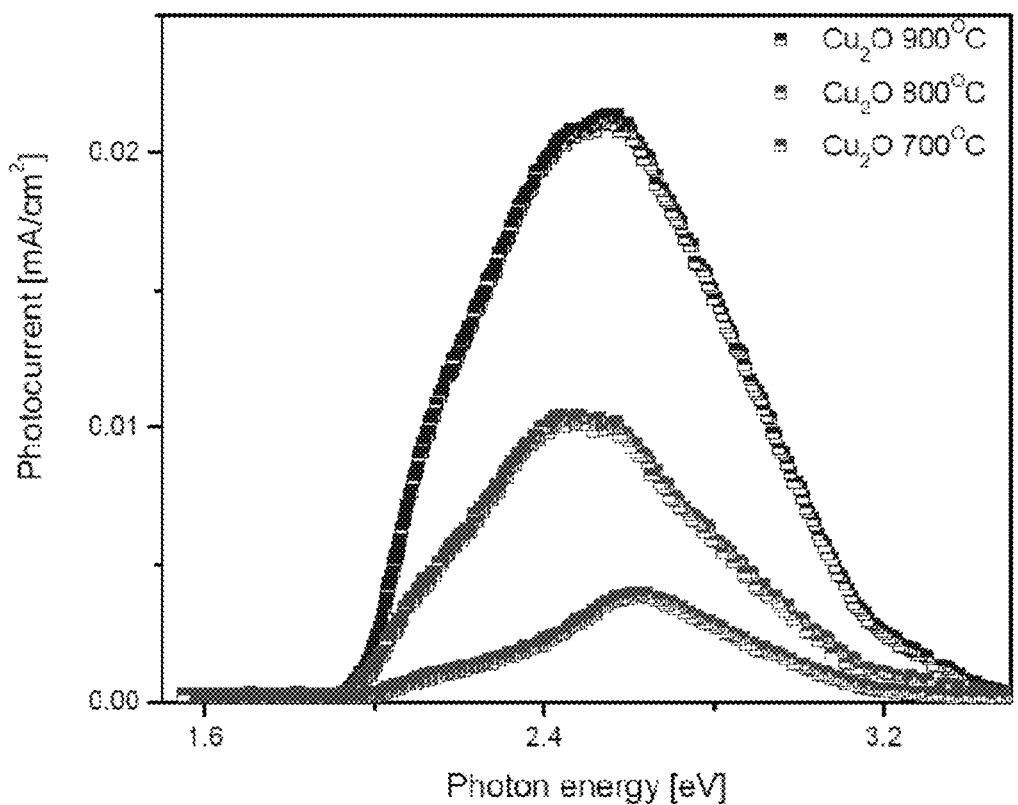

FIG. 5 provides a graph showing photocurrent versus photon energy measured with surface gel probe on $Cu_2O$ films prepared in air at various temperatures.

Figure 6:
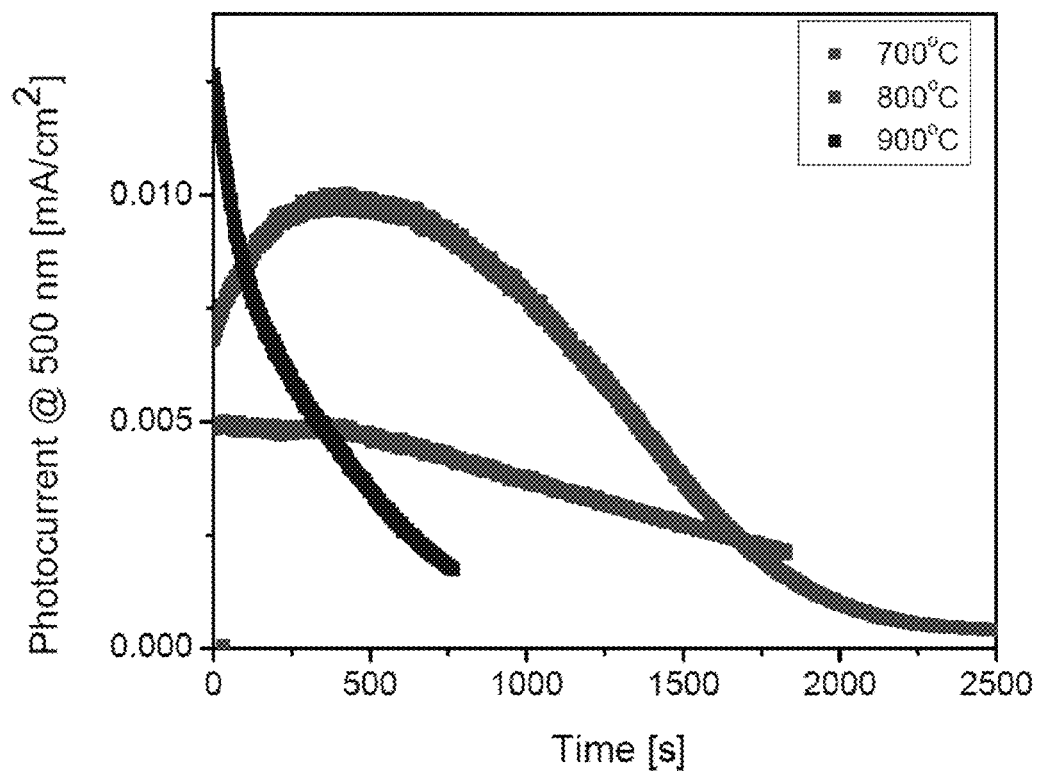

FIG. 6 provides a graph of photocurrent (500 nm) decay versus time for the $Cu_2O/CuO$ films measured with aqueous gel electrolyte.

Figure 7:
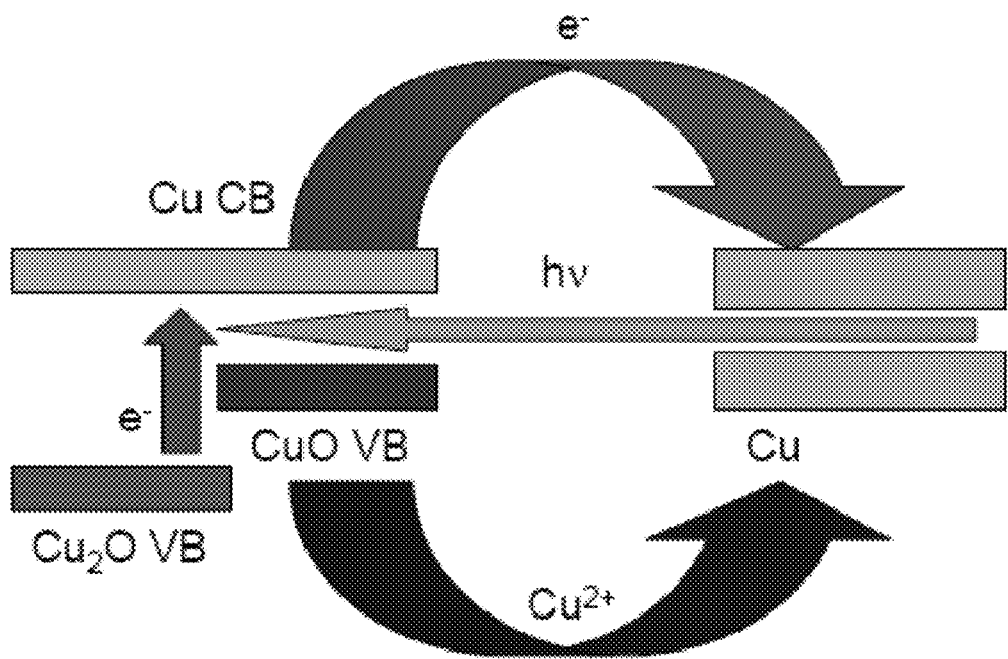

FIG. 7 provides a schematic of a proposed mechanism for photocurrent measurement with aqueous gel probe.

Figure 8:
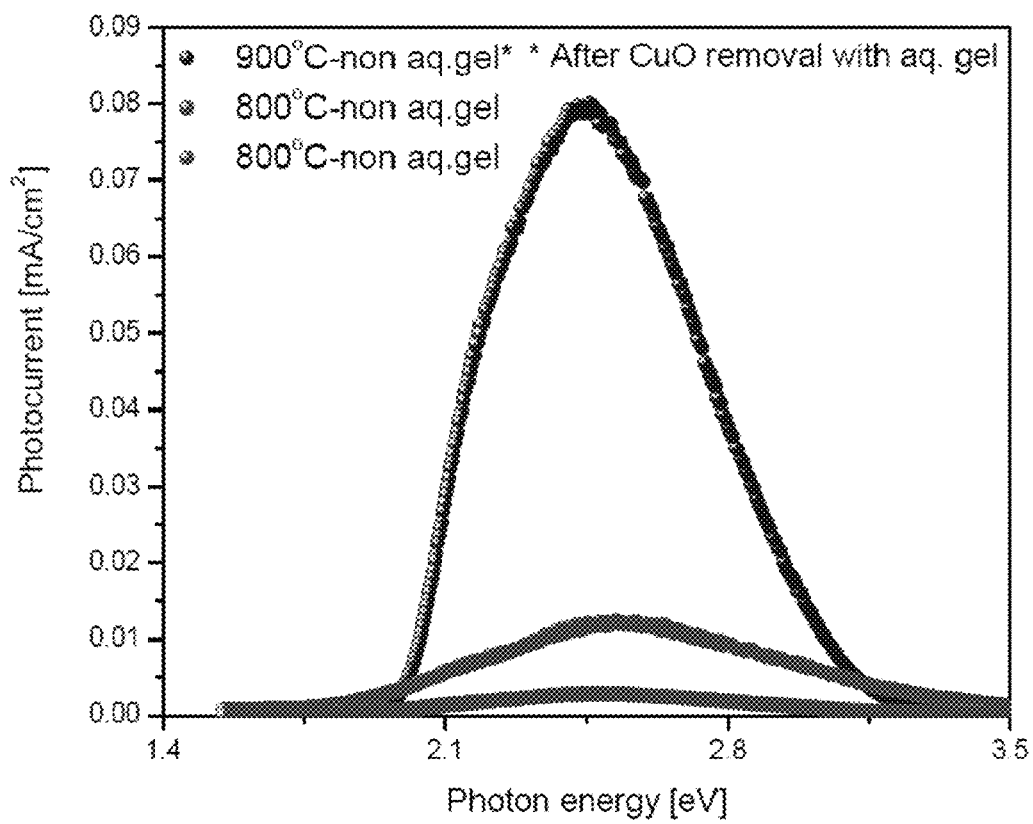

FIG. 8 provides a graph of the photocurrent versus photon energy measured with non-aqueous gel on $Cu_2O$ films prepared in air at various temperatures.

Figure 9:
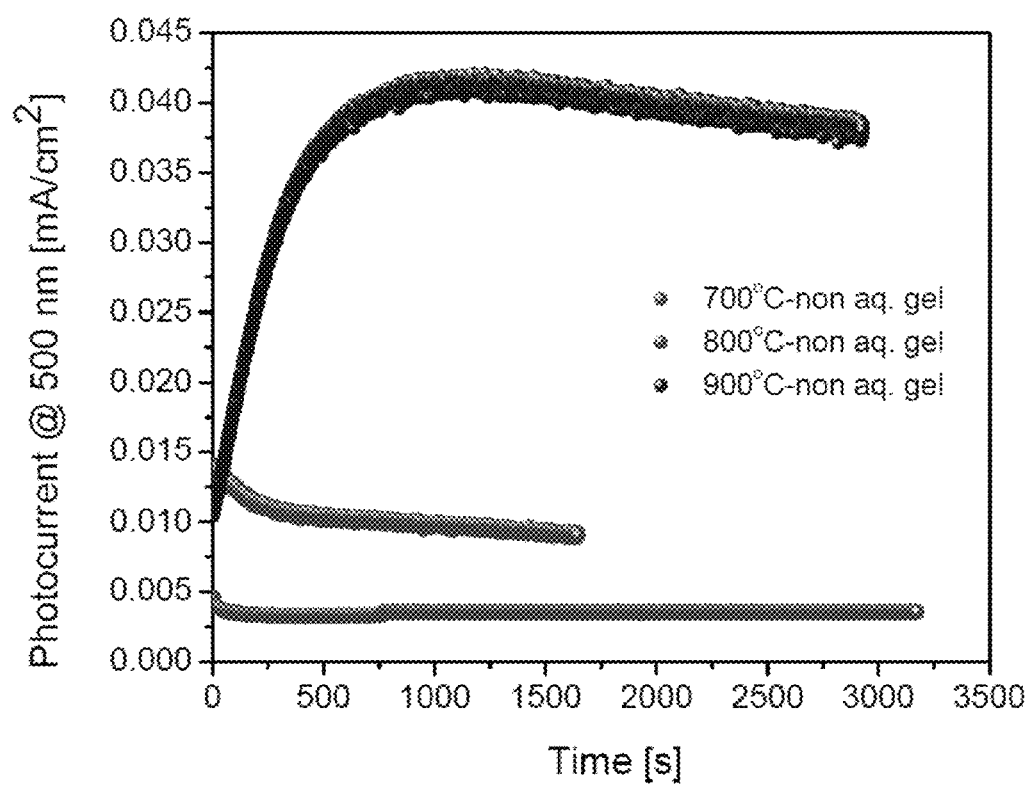

FIG. 9 provides a graph of the photocurrent (500 nm) decay versus time for the $Cu_2O/CuO$ films measured with non-aqueous gel electrolyte.

Figure 10:
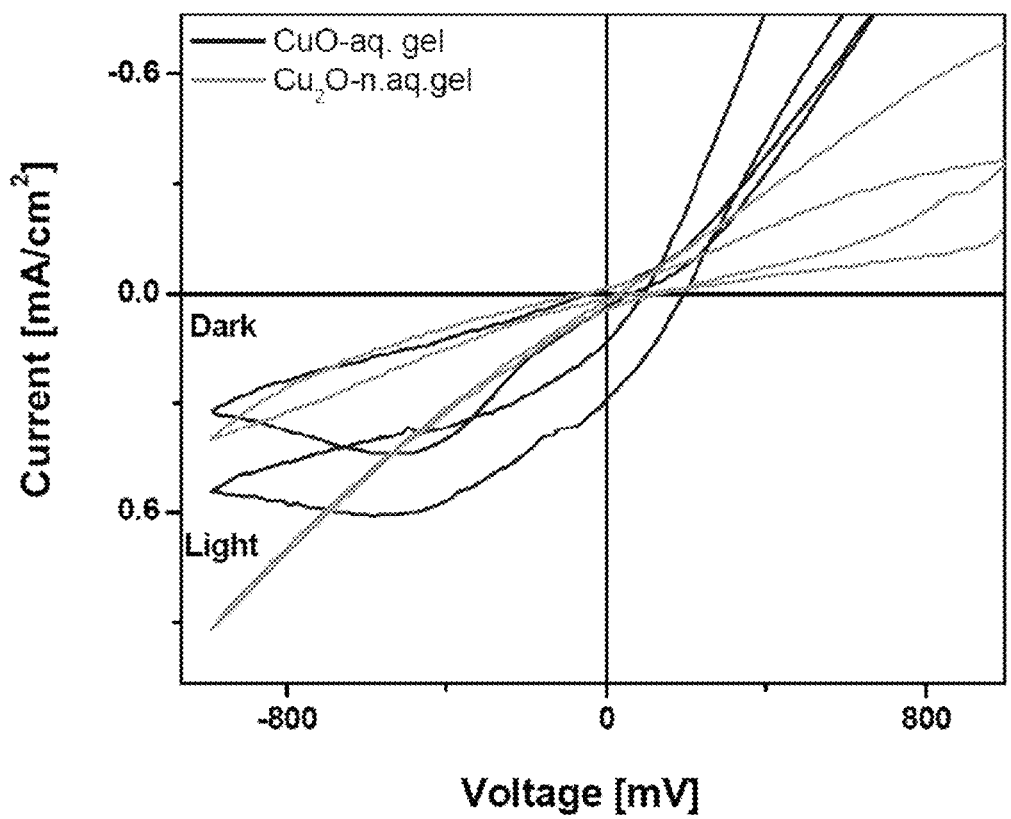

FIG. 10 provides an I-V cyclic voltamogram of the $Cu_2O$ film grown at 900° C. (with CuO layer removed) using aqueous or non-aqueous gel in the dark or under 1 sun AM 1.5 illumination (FTO counter electrode).

Figure 11:
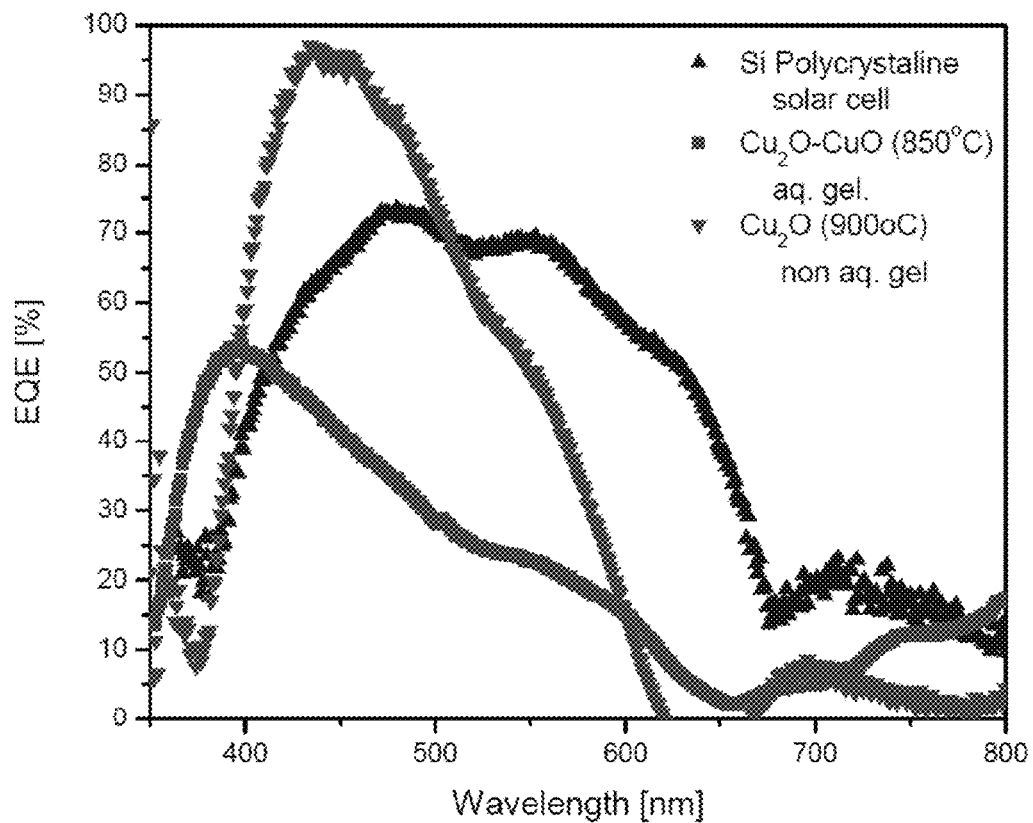

FIG. 11 provides a graph of EQE versus wavelength measured with surface gel probe on Si polycrystalline solar cell superimposed with $Cu_2O$.

Figure 12:
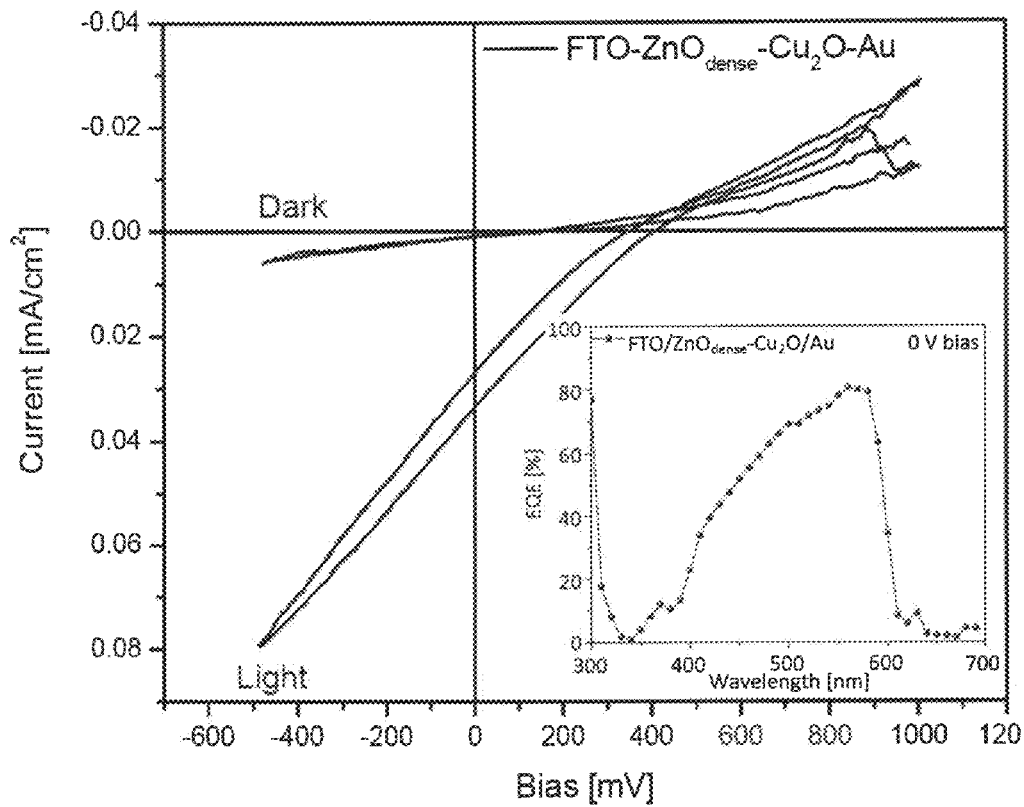

FIG. 12 provides I-V plots of FTO/ZnO—$Cu_2O$/Au device in dark and under AM 1.5 simulated sunlight. EQE of similar device is shown in inset.

Figure 13:
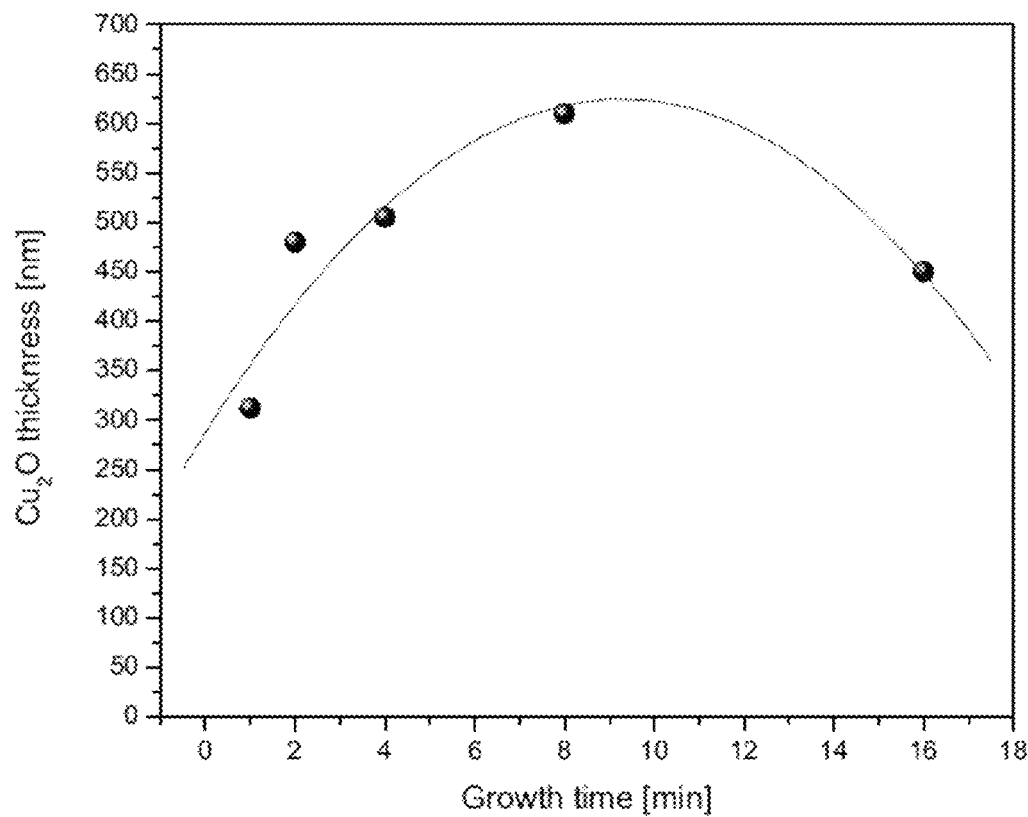

FIG. 13 provides a graph of the profilometer $Cu_2O$ thickness versus reaction time in boiling 10 wt. % $CuSO_4$ aqueous solution.

Figure 14:
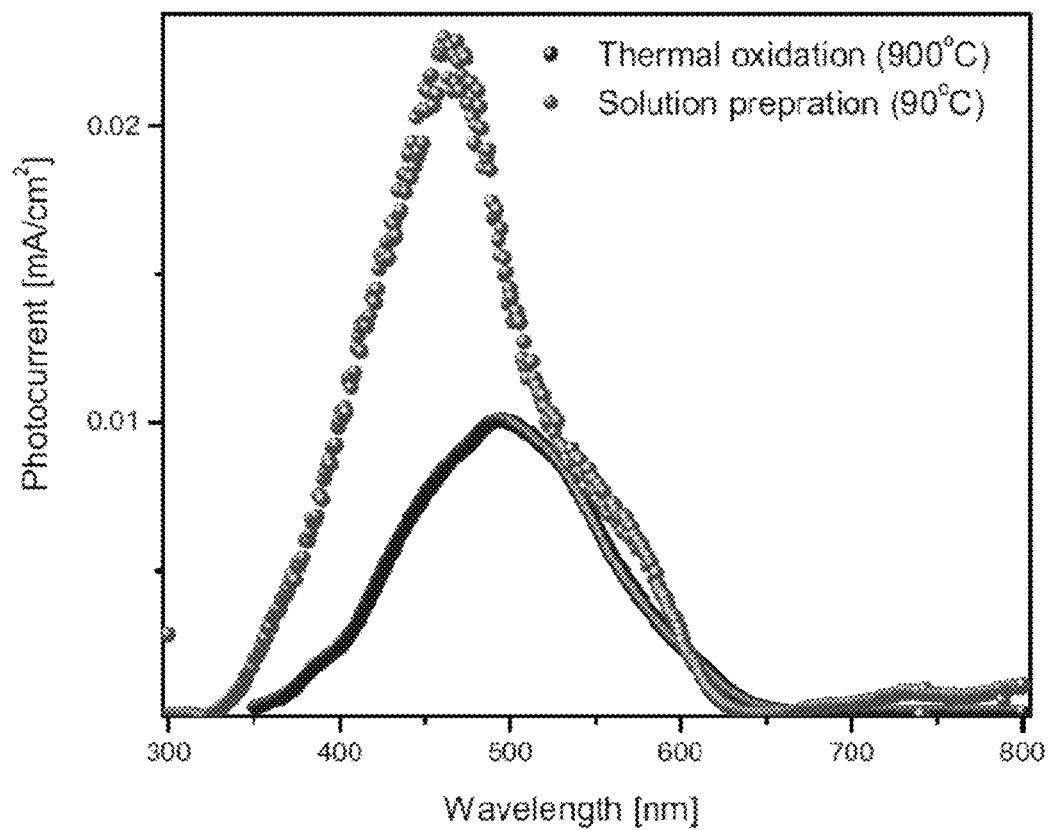

FIG. 14 provides a graph of photocurrent versus wavelength for $Cu_2O$ films prepared via thermal oxidation (900° C.) or solution conversion (90° C.) of copper foils.

Figure 15:
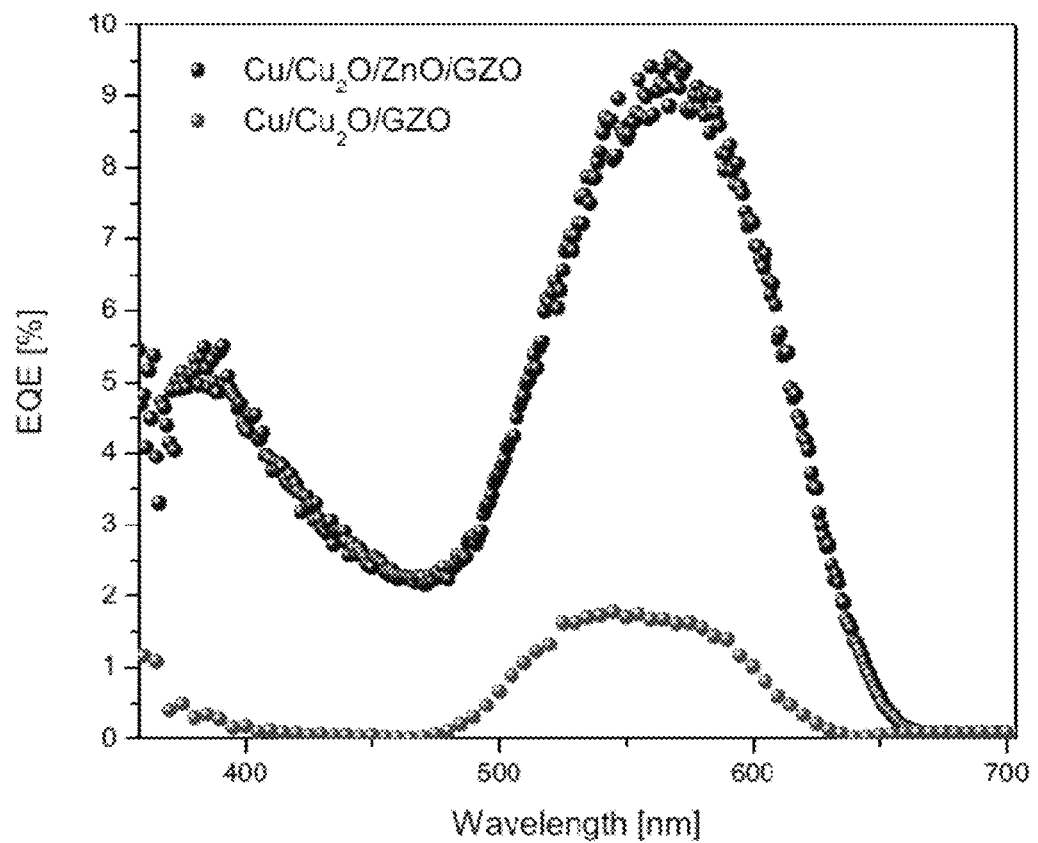

FIG. 15 provides a graph of the external quantum efficiency (EQE) of same $Cu/Cu_2O$/GZO photovoltaic cells with or without 50 nm MOCVD grown ZnO buffer layer between $Cu_2O$ and GZO.

Figure 16:
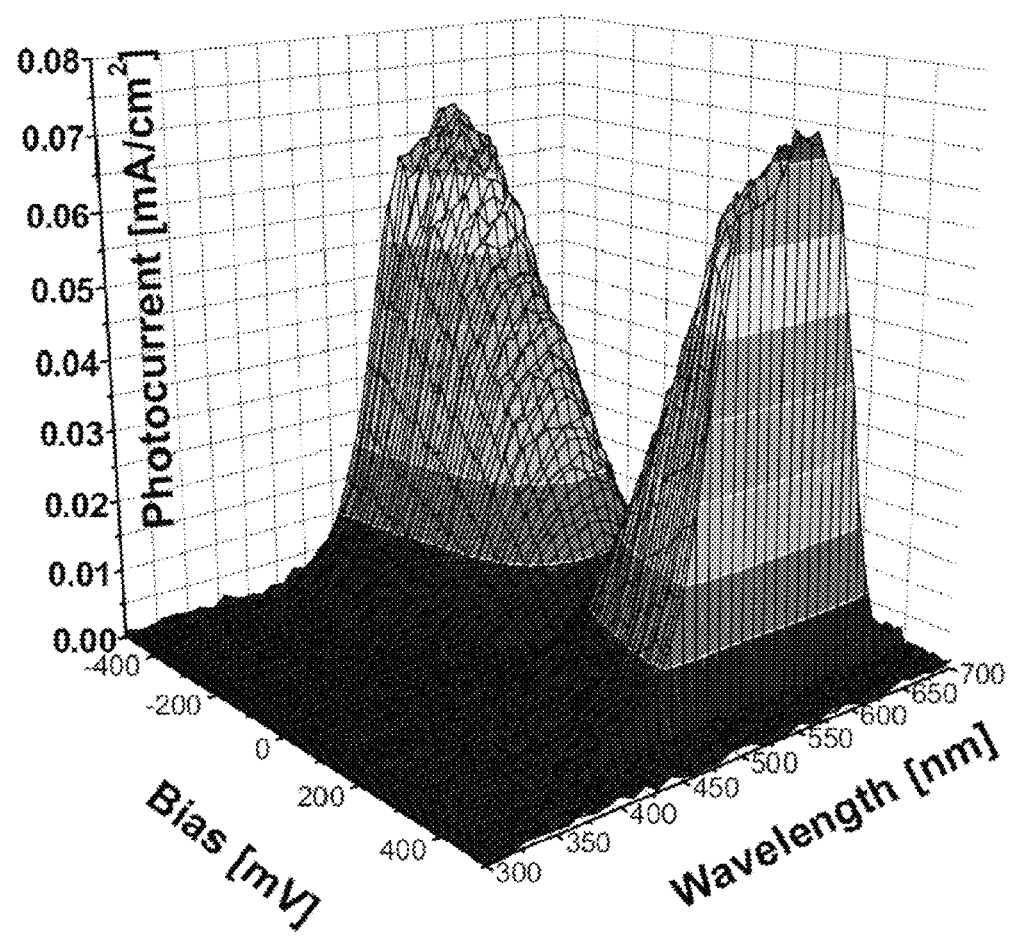

FIG. 16 provides a 3D plot of photocurrent vs. wavelength vs. bias for $Cu/Cu_2O$/ZnO/GZO.

Figure 17A:
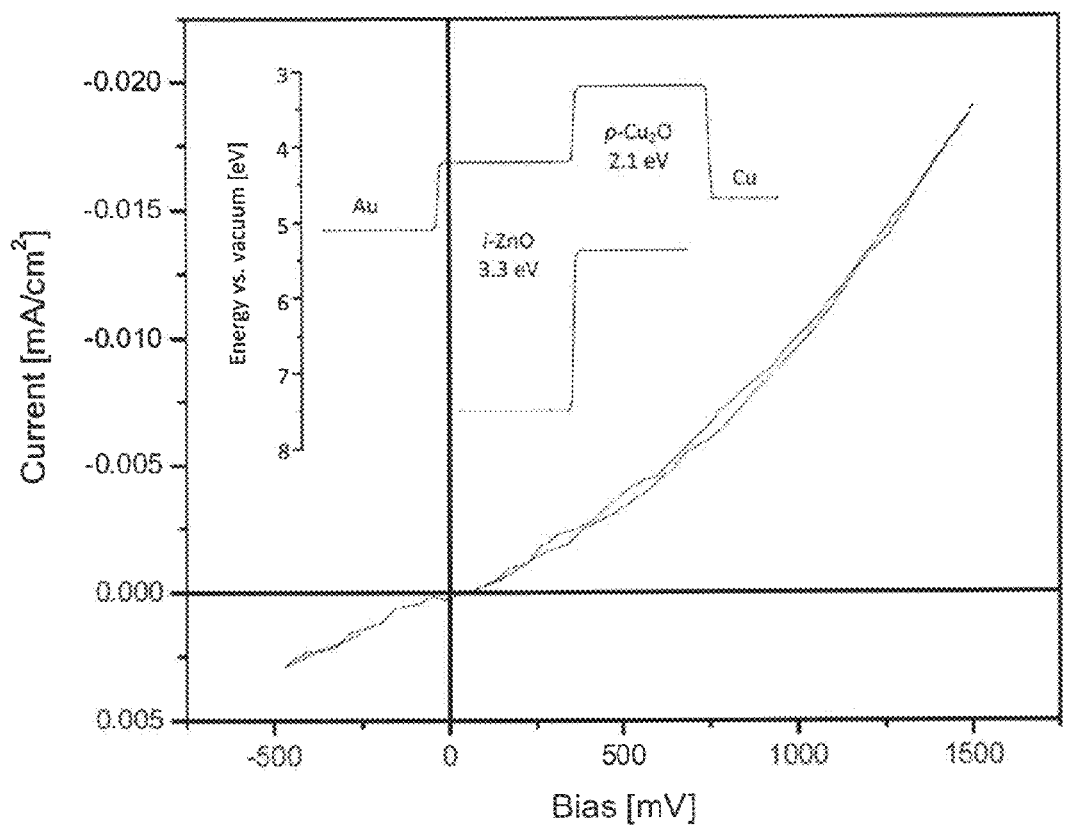
Figure 17B:
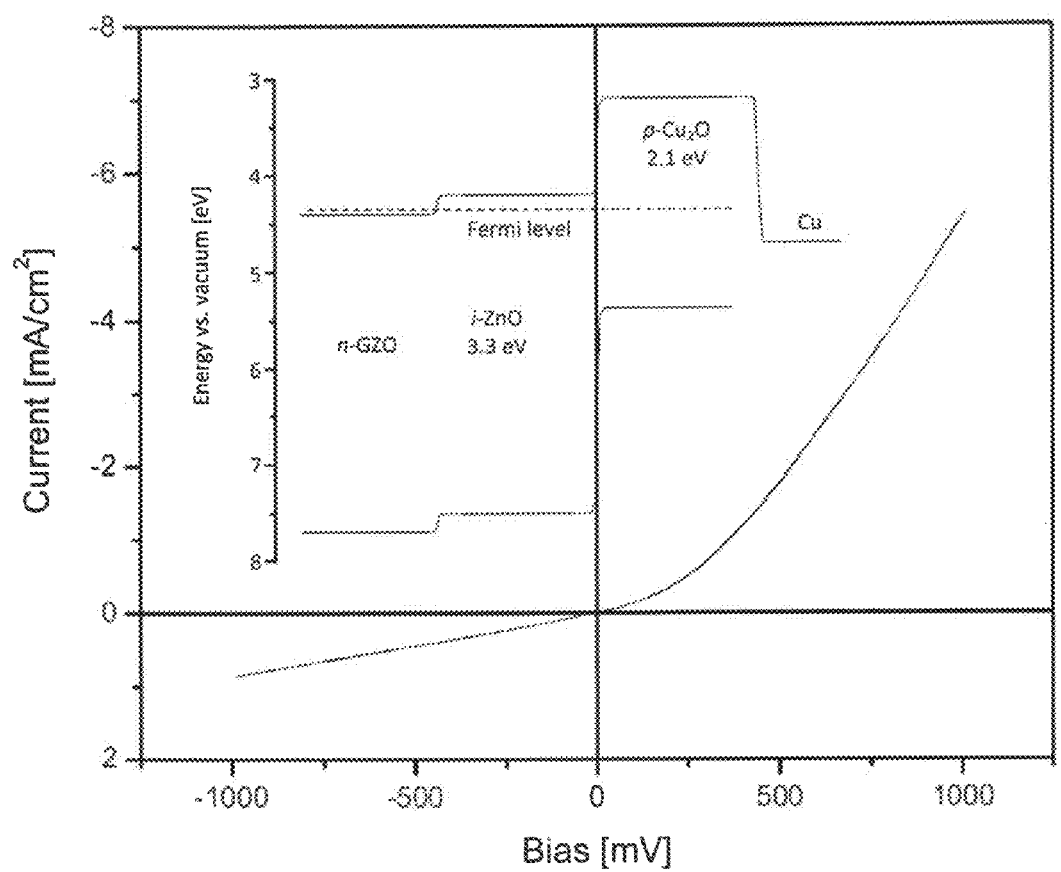
Figure 17C:
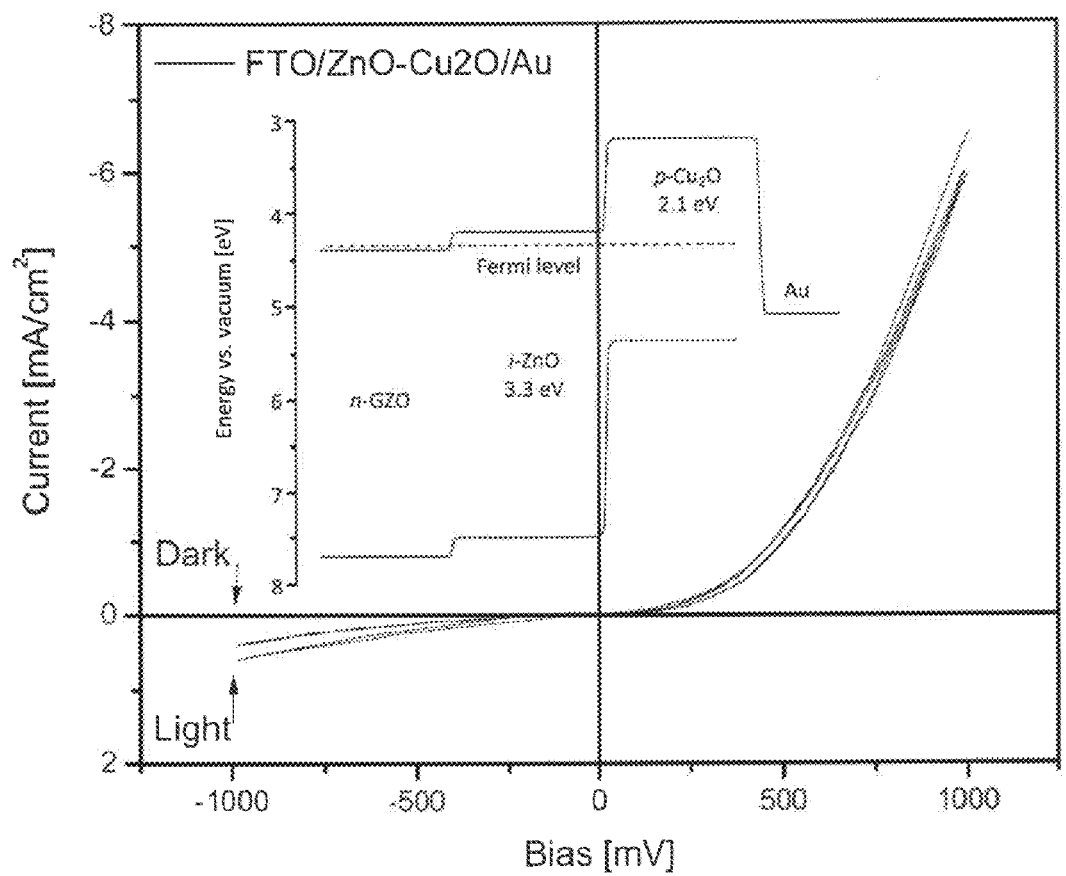

FIG. 17A provides an I-V plot in the dark for $Cu/Cu_2O$/ZnO/Au device (0.07 $cm^2$), with corresponding band diagram (inset). FIG. 17B provides an I-V plot in the dark and light for $Cu/Cu_2O$/ZnO/GZO device (0.07 $cm^2$), with corresponding band diagram (inset). FIG. 17C provides an I-V plot in the dark and light for FTO/ZnOnt/$Cu_2O$/Au devices (0.07 $cm^2$), with corresponding band diagram (inset).

DETAILED DESCRIPTION OF THE INVENTION

Cuprous oxide ($Cu_2O$) is a promising low cost p-type photovoltaic absorber (Siripala et al. (1989) Semi. Sci. Technol., 4:465-468; Shanid et al. (2008) Thin Solid Films, 516:6245-6252). $Cu_2O$ is a natural p-type direct-gap semiconductor with bandgap energy of 2.1 eV. It can be calculated that $Cu_2O$ homojunctions have a theoretical energy conversion efficiency of 20% (Tanaka et al. (2005) Appl. Surf. Sci., 244:568-572). $Cu_2O$ can be prepared by electrodeposition from copper salts, either galavanostatically (Mukhopadhyay et al. (1992) Thin Solid Films. 209:92-96; Tang et al. (2005) Materials Letters 59:434-438) or potentiostatically (Wijesundera et al. (2006) Thin Solid Films. 500:241-246). Electrodeposition is also the only method which can produce n-type $Cu_2O$ (Han et al. (2009) Electrochem. Solid State Lett., 12:H89-H91) and n-p Cu$_2$O homojunctions (Wang et al. (2007) Electrochem. Solid State Lett., 10:H248-H250). Other methods generally produce p-type Cu$_2$O. Metal organic chemical vapor deposition (MOCVD) can be used with various metal-organic precursors such as copper(I)tert-butoxide (Jeffries et al. (1992) Chem. Materials. 4:1169-1175), Cu(acac)$_2$ (Condorelli et al. (1994) Chem. Materials. 6:1861-1866; Condorelli et al. (1995) Chem. Materials. 7:2096-2103), or copper (II) hexafluoroacetylacetonate (Jeong et al. (2009) J. Cryst. Growth. 311:4188-4192). Chemical vapor deposition (CVD) was demonstrated with copper dipivaloymethanate (Maruyama, T. (1998) Solar Energy Mater. Solar Cells. 56:85-92). Spray pyrolysis from a mixture of copper (II) acetate, glucose and 2-propanol has also been reported (Kosugi et al. (1998) J. Am. Ceram. Soc., 81:3117-3124). Radio frequency magnetron sputtering is another well studied growth method for Cu$_2$O (Ishizuka et al. (2000) Japanese J. Appl. Phys. Part 2-Letters. 39 (2000) L786-L788; Reddy et al. (2006) Physica Status Solidi A-Applications and Materials Science. 203:844-853; Ghosh et al. (2000) Vacuum. 57:377-385). Pulsed laser deposition can be used as well (Chen et al. (2009) Vacuum. 83:927-930). Thermal oxidation of copper sheets in low oxygen atmospheres is another well known route to Cu$_2$O (Musa et al. (1998) Solar Energy Mater. Solar Cells. 51:305-316; Jayatissa et al. (2009) Appl. Surf. Sci. 255:9474-9479). Colloidal syntheses have been reported to prepare Cu$_2$O nanocages (Lu et al. (2005) Adv. Mater. 17:2562-2567), nanocubes (Yang et al. (2008) Nanotechnology. 19:025604-1-7), and bi-pyramids (Jimenez-Cadena et al. (2010) Mater Lett., 64:469-471).

Previously, it has been shown that one can deposit p-Cu$_2$O onto n-ZnO to realize a p-n heterojunction either by electrochemical deposition (Zhang et al. (2004) Physica B 351:178-183) or by magnetron sputtering (Akimoto et al. (2006) Sol. Energ. 80:715-722). Several transparent conducting oxide/Cu$_2$O heterojunctions have been tested, and good photovoltaic results ($\eta_{4M\ 1.5}$=1.2%) were obtained with Al-doped ZnO—Cu$_2$O (Tanaka et al. (2004) Thin Solid Films 80:469-470). The highest efficiency reported to date was 2% in a sputtered MgF$_2$/ITO/ZnO/Cu$_2$O device using MgF$_2$ as anti-reflection coating (Mittiga et al. (2006) Appl. Phy. Lett. 88:163502-1-2). Recently, Cu$_2$O/n-ZnO nanowires solar cells on Ga-doped ZnO/glass templates have been produced by sputtering (Hsueh et al. (2007) Scripta Materiala 57:53-56). All nanowires Cu$_2$O and ZnO solar cells have also been proposed (Yuhas et al. (2009) J. Am. Chem. Soc., 131:3756-3761). However, Cu$_2$O external quantum efficiency is vastly dependant on its morphology, crystallinity and oxygen vacancy contents related to the preparation methods (Millet et al. (1995) Corros. Sci., 37:1903-1918). Furthermore, many applications are forbidden by its instability. In this context, a practical measurement technique was sought to evaluate the external quantum efficiency and the stability of Cu$_2$O samples for photovoltaic applications.

A new method and gel probe is described herein for measuring photocurrent action spectra of a metal (e.g., cuprous oxide thin films (e.g., those described above)), without the need for assembling solar cells or using a liquid electrolyte cell. Thus, external quantum efficiency of photoactive films can be measured directly without coating a transparent conducting oxide layer or using metal evaporation for contacts. With an aqueous gel, a dissolution of the CuO and Cu$_2$O layers is observed, causing photocurrent decay. The replacement of the aqueous gel electrolyte with a non-aqueous gel electrolyte significantly stabilized photocurrents. A mechanism is proposed to account for all the electrochemical observations.

As stated above, a new type of photoelectrochemical probe has been demonstrated for directly measuring photocurrent on the surface of a semiconductor such as Cu$_2$O. As used herein, "photocurrent" refers to the electrical current produced by a substance in response to the input of light. The semiconductor can be prepared or coated on opaque metals collecting the photocurrent, while the metal surrounding the light spot on the probe does act as a back contact through a gel electrolyte. An EQE of 95% at 400 nm was measured on Cu$_2$O film prepared at 850° C. with this technique. The gel itself affects the surface chemistry of copper oxide, resulting in photocurrent decay. The replacement of the aqueous gel with a nonaqueous gel suppressed the CuO and Cu$_2$O dissolution, resulting in greatly stabilized photocurrents. These results have important consequences, because both a new measurement technique and a new type of photoelectrochemical solar cell are described herein.

A new preparation method for highly photoactive Cu$_2$O films is also presented. Copper foils oxidized at 900° C. in air are covered with a semi-insulating CuO layer, which can be electrochemically removed using the aqueous gel. Cu$_2$O photocathode combined with a non-aqueous redox gel is the basis for a new class of low cost and flexible solar cells. Solid-state photovoltaic devices using FTO/ZnO—Cu$_2$O/Au configuration were also tested, and the high EQE value of 80% confirmed the measurements obtained with the gel probe.

In a particular embodiment, the probe of the instant invention comprises a probe tip in contact with a gel electrolyte which can be applied to the surface of a sample (e.g., metals, semiconductors, etc.) in order to collect photocurrent useful for the measurement of external photocurrent quantum efficiency. In a particular embodiment, the tip is machined out of a metal, particularly copper. The gel electrolyte is preferably capable of carrying holes and forming a photocell with the semiconductor. In a particular embodiment, the gel comprises a mixture of copper sulfate, PVDF, and N-methyl pyrrolidinone. The probe further comprises a fiber optic probe (e.g., a commercial fiber optic reflection probe) to bring light through the tip to the sample surface.

In contrast to photocurrent measurement techniques of the prior art, the photocurrent measurement technique of the instant invention avoids the use of metal evaporation or a liquid cell in which the sample is immersed. The photocurrent measurement techniques of the instant invention also greatly simplify these types of measurements.

In accordance with one aspect of the instant invention, photocurrent measurements are made using a fiber optics probe terminated by a metal (e.g., a conductor; e.g., Cu) contact and using a spacer and a gel electrolyte directly applied to the surface of a sample (e.g., a metal, particularly a semiconductor). In a particular embodiment, the spacer is an electrical insulator comprising any suitable insulative material including, but not limited to, rubber, plastics, ceramics and glass. In a particular embodiment, the spacer is a plastic, particularly polytetrafluoroethylene (PTFE; Teflon®). A light beam (e.g., a chopped monochromatic light beam (e.g., 40 Hz)) is directed by the optical fibers on the sample. Upon excitation of the bandgap, holes or electrons react with the gel electrolyte, causing a photocurrent, which is collected by the metal surrounding the probe. This small AC photocurrent may be amplified by an amplifier (e.g., a lock-in amplifier or phase-sensitive detector), optionally by a potentiostat, to obtain the photocurrent spectrum. In a particular embodiment, electrical connections are made between probe and sample to the amplifier. Calibration of the light input power with a photodiode enables one to calculate the external quantum efficiency of the film. The spacer fixes the distance from probe to sample and the device area is fixed by the illumination spot diameter.

In a preferred embodiment of the instant invention, the electrolyte gel is non-aqueous. In a particular embodiment, the electrolyte gel comprises at least one of metal or metal salt (e.g., Cu, Mn, Fe, Co, Ni, and Zn). In another embodiment, the electrolyte gel comprises at least one salt, sulfate, acetate, nitrate, and/or chlorite (e.g., of the above metals). In another embodiment, the electrolyte gel comprises $CuSO_4$. The electrolyte gel may further comprise a polar solvent, particularly a chemical stable or inert polar solvent. Examples of polar solvents include, without limitation, N-methylpyrrolidone (NMP), propylene carbonate, methoxypropionitrile, gamma-butyrolactone (GBL), and the like and mixtures thereof. The electrolyte gel may further comprise a polymer (for gelling), particularly a soluble polymer, particularly a polymer with ionic conductivity or which does not interfere with ionic conductivity. In a particular embodiment, the soluble polymer is poly(vinylidene fluoride), poly(vinylidene fluoride-co-hexafluoropropene) (PVDF-HFP), poly(acrylonitrile), polyethylene oxide), poly(methyl metacrylate), polyimide, or the like or mixtures thereof.

In accordance with another aspect of the instant invention, methods of producing cuprous oxide ($Cu_2O$) are provided. The resultant cuprous oxide may be greater than 90%, 95%, or 99% pure $Cu_2O$ and/or have no detectable CuO. In a particular embodiment, the method comprises maintaining copper in a boiling aqueous solution of $CuSO_4$. In a particular embodiment, the aqueous solution of $CuSO_4$ is about 1 wt. % to about 50 wt. %, about 5 wt. % to about 25 wt. %, or about 10 wt. % $CuSO_4$. The copper may be micropolished and/or rinsed with alcohol (e.g., methanol) prior to treatment. In a particular embodiment, the copper is maintained in the boiling aqueous solution for less than about 15 minutes, particularly about 10 minutes or less.

The instant invention also encompasses methods of preparing devices (e.g., photovoltaic devices) using the $Cu_2O$ substrates prepared by the above methods. As used herein, the term "photovoltaic" refers to material (e.g., a semiconductor) that absorbs electromagnetic energy such as light energy and converts the energy into electrical energy. In a particular embodiment, the instant invention provides methods of synthesizing $Cu_2O$/ZnO photovoltaic devices comprising 1) synthesizing a $Cu_2O$ substrate in accordance with the methods hereinabove and 2) depositing a layer of ZnO on the $Cu_2O$ substrate (e.g., by spin coating or MOCVD). Alternatively, copper may be layered with the ZnO and then boiled in $CuSO_4$ to generate cuprous oxide, as described above. The methods may further comprise the addition of a top contact (e.g., transparent or semi-transparent; e.g., Au or Ga-doped zinc oxide).

The following examples describe illustrative methods of practicing the instant invention and are not intended to limit the scope of the invention in any way.

EXAMPLE 1

Experimental

Photocurrent measurement was achieved very simply with a fiber optics probe terminated by a metal contact, and using a Teflon® spacer and gel electrolyte directly applied to the surface of semiconductors. A chopped monochromatic light beam (40 Hz) is directed by the optical fibers on the semiconductor. Upon excitation of the bandgap, holes or electrons react with the gel electrolyte, causing a photocurrent, which is collected by the metal surrounding the probe. This small AC photocurrent is amplified by lock-in amplifier (EG&G 5210), and the photocurrent spectrum is obtained. Calibration of the light input power with a photodiode enables calculation of the external quantum efficiency of the film. The Teflon® spacer fixes the distance from probe to substrate, and the device area is fixed to 0.03 $cm^2$ by the illumination spot diameter (FIG. 1). This method is very effective to characterize the impact of blocking layers, or semiconductor preparation conditions and thickness on the photocurrent efficiency.

An aqueous gel for photocurrent measurement was prepared as follows: 2.7 g lactic acid and 1 g $CuSO_4$ were dissolved in 10 mL deionized water and gelled with 0.5 g Methocel™. This resulted in a gel of 3 mol/L lactic acid and 0.4 mol/L $CuSO_4$. The photocurrent spectra were measured with a fiber optics reflection probe (Ocean Optics) terminated by the photocurrent measurement electrode. A small amount of gel was applied to the surface of the $Cu_2O$—CuO film, and the probe was applied on the gel. Electrical connections were made between probe and sample to an EG&G 5210 lock-in amplifier. Monochromatic chopped light was directed to the sample through optical fibers, from an Oriel Cornerstone 130 monochromator illuminated with a Xenon light source.

X-Ray Diffraction (XRD) Characterization of the Copper Oxide Films

Cu/$Cu_2O$/CuO films were prepared by oxidation of Cu foils in air for 10 minutes at the temperatures of 700, 800 and 900° C., and characterized by XRD (FIG. 2).

The films prepared at 700° C. and 800° C. films are showing mixture of CuO and $Cu_2O$ phases, while the 900° C. film appears to be mostly $Cu_2O$ (Li et al. (2009) J. Crystal Growth 311:1102-1105). The 900° C. $Cu_2O$ phase has preferred (1 1 1) orientation, and the (1 1 1) orientation increases with the temperature. The total thickness of Cu and $Cu_2O$ layers was in the 15 microns range, as measured with a laser confocal NSOM microscope (Keyence VK-9700).

UV-Vis Absorption of the CuO and $Cu_2O$ Phases

In all the films, an apparently grey CuO phase is covering the purple-red $Cu_2O$. UV-vis absorption of the two phases was measured with a reflection probe, using a white Teflon® reference. These measurements indicate an optical bandgap, calculated as 1240/λ with λ half the absorption edge, of 1.52 and 1.93 eV for CuO and $Cu_2O$, respectively (FIG. 3). It can then be inferred that the CuO phase is transparent to the light wavelengths at which $Cu_2O$ is photoactive. Thus, if the CuO conductivity is sufficient, photocurrent measurements can be made directly on the CuO layer. Next, EIS measurements were used to evaluate the resistivity of the CuO layer.

Electrochemical Impedance Spectroscopy

Electrochemical impedance spectroscopy (EIS) is a powerful technique for the electrical characterization of passivation films, with many applications in corrosion science and electrochemistry. A small AC signal of variable frequency is used to probe signal attenuation and phase shift, which can be represented as a complex number:

$$Z = \frac{E}{I} = Z_0 \exp(j\phi) = Z_0(\cos\phi + j\sin\phi) \tag{1}$$

The measurements are usually represented as a Nyquist plot, where the real part is plotted on the X axis and the imaginary part on the Y axis. Resistive oxides such as $Cu_2O$ are electrically equivalent to a resistor and capacitor in parallel, which cause a semi-circle Nyquist plot, where the diameter of the semi-circle can be ascribed to the electrical resistance of the oxide layer. AC impedance measurements were performed on the films grown at 700, 800 and 900° C. (FIG. 4). The copper probe was spring loaded and applied directly to the surface of the CuO films without gel. The resistivity of the CuO layer was found to increase with growth temperature.

Photocurrents Measurements with Aqueous Gel Electrolyte

The photocurrents measured indicated that the photocurrent originated from the $Cu_2O$ layer, as the onset photocurrent matched the $Cu_2O$ bandgap of 1.9 eV (~590 nm). However, the results showed that the CuO layer did not block the photocurrent, which indicated it had sufficient conductivity and transparency. On both CuO and $Cu_2O$ layers, the photocurrent increased with preparation temperature, possibly indicating the effect of better hole mobility due to increased crystallinity of the layers (FIG. 5). After measurement on CuO, a change of color from grey (CuO) to purple-red ($Cu_2O$) was observed under the gel. This indicates that the gel promoted the dissolution of the CuO layer, and could possibly explain why little difference was observed between CuO and $Cu_2O$ photocurrents measured with the gel.

Since photocurrent stability is a major issue with $Cu_2O$ electrodes, the photocurrent stability was studied with the gel electrode at the fixed wavelength of 500 nm corresponding to peak of photocurrent, and 40 Hz chopper frequency (FIG. 6). The effect of growth temperature on photocurrent was confirmed on a second series of samples. It was also observed a faster decrease of photocurrent with higher growth temperature. In the case of the film grown at 900° C., there is a direct photocurrent decrease. For the films grown at 800 and 700° C., there is an initial photocurrent increase, followed by a decrease. These results suggest that the CuO layer has a protective effect on the $Cu_2O$ layer, but also reduces photocurrent. Hence, its initial thickness and dissolution rate has an effect on the photocurrent, and its evolution with time. The XRD results indicate the CuO layer would be thinner in the film grown at 900° C. This is consistent with a higher initial photocurrent, but faster photocurrent decrease.

Photocurrents Measurements with Non-Aqueous Gel Electrolyte

To summarize the observations, when the circuit is closed and exposed to light, a photocurrent, CuO dissolution at the $Cu/Cu_2O/CuO$ electrode, and Cu plating on the Cu electrode is observed (evidenced by using FTO electrode instead of Cu). These observations can be reconciled with the following mechanism, schematically represented on (FIG. 7).

At $Cu/Cu_2O/CuO$ electrode:
1) Hole formation in $Cu_2O$: $2Cu_2O+h\nu \rightarrow 2Cu_2O+2e-$
2) Water oxidation: $H_2O \rightarrow 2H^+ + \frac{1}{2}O_2 + 2e^-$
3) CuO dissolution: $CuO+2H^+ \rightarrow Cu^{2+}+H_2O$
4) $Cu_2O$ dissolution: $Cu_2O+2H^+ \rightarrow 2Cu^{2+}+H_2O$ At Cu electrode:

$$Cu^{2+}+2e^- \rightarrow Cu$$

According to this mechanism, the presence of water in the gel plays a major role in the CuO and $Cu_2O$ dissolution mechanism. It was then anticipated that a non aqueous gel would prevent this dissolution, and improve the photocathode stability. In previous work, a PVDF/NMP based redox gel electrolyte for dye sensitized solar cells was developed (Du Pasquier, A. (2007) Electrochim. Acta 52:7469-7474). Based on this experience, a new non-aqueous gel was prepared by dissolving 1 g $CuSO_4$ in 10 mL N-methylpyrrolidinone (NMP), and gelling it with 1 g PVDF-HFP (Kynar 2801). The photocurrent measurements showed similar photocurrents as with the aqueous gel (FIG. 8), but the stability of photocurrent versus time was significantly improved in all films (FIG. 9). There is still some decay, with a much slower rate that can be attributed to solvent evaporation from the gel.

Thus, it can be concluded that dissolution of the superficial CuO layer was indeed occurring and exacerbated by water. It is also visible that films with thicker CuO layer generate less photocurrent but are more stable.

Based on these considerations, it was concluded that the aqueous gel is useful to remove the CuO layer, and the non-aqueous gel is better for obtaining stable photocurrents with the $Cu_2O$ layer. Hence, for obtaining both high and stable photocurrents, a film grown at 900° C. was taken, its CuO layer with the aqueous gel was removed, it was cleaned with methanol, and then it was tested with the non-aqueous gel. The highest photocurrent was obtained by using this procedure.

I-V Curves of the $Cu_2O$ Films

I-V testing of $Cu_2O$ films grown at 900° C. was performed by clamping the films with the gel and FTO-glass counter electrode. A polyimide tape was used as spacer to prevent device shorting, defining 1.62 $cm^2$ electrode photoactive area. An Oriel Xenon light source with AM 1.5 filter was used for illumination, and the light intensity was calibrated to 100 $mW/cm^2$ (1 sun) with a Newport 841-P-USB thermopile. The results indicate clear photocurrent in the $mA/cm^2$ range under 1 sun illumination, with both types of gels. In the case of the non-aqueous gel, there is less current hysteresis between sweep directions, indicating a less capacitive behavior of the electrode. This could be related to less photocorrosion of the photocathode occurring in the non-aqueous gel electrolyte (FIG. 10). Such high photocurrent under simulated sunlight appears to be promising for solar cell applications. However, better fill factor and open-circuit voltage would be necessary to obtain useful power conversion efficiency.

EQE Calculations

Finally, the system light intensity was calibrated with a Si photodiode in order to enable the calculation of EQE. The solar cell responsivity $PR_\lambda$ is given by:

$$PR_\lambda = I_\lambda/P_\lambda \qquad (2)$$

Where $I_\lambda$ ($mA/cm^2$) is photocurrent and $P_\lambda$ ($mW/cm^2$) is the incident optical power as a function of incident wavelength. From (1), the EQE is defined as:

$$EQE_\lambda = PR_\lambda hc/\lambda e \qquad (3)$$

Where h is Planck constant, c is the speed of light in vacuum, $\lambda$ is the wavelength of the incident photon, and e is the charge of the electron. EQE measurements with the gel probe were performed on a polycrystalline silicon solar cell, and a $Cu_2O$ film prepared at 850° C. In the case of the polycrystalline silicon solar cell, a peak EQE of 75% was measured, which is in the expected range for this device. In the case of the $Cu_2O$ film measured in the exact same conditions, a peak EQE of 55% was measured at 400 nm, and the EQE at 500 nm was 28% with aqueous gel. A peak EQE of 95% was measured in the case of a film grown at 900° C. and after removal of the CuO layer (FIG. 11). It may appear surprising that a higher EQE is measured on $Cu_2O$ than in the Si solar cell. However, in EQE experiments, the photocurrents measured are very low, and not affected by the device series resistance. In simulated sunlight, the effect of series resistance becomes predominant because the photocurrent is orders of magnitude higher than in EQE experiments, and heat losses occur by joule effect. For this reason, two different devices such as $ZnO/Cu_2O$ and Si solar cells may both have high EQE values, but vastly different short-circuit currents in simulated sunlight.

I-V Curves of FTO/ZnO—Cu$_2$O/Au Device

A FTO/ZnO—Cu$_2$O/Au device was also tested, where 150 nm dense ZnO film was grown by MOCVD on commercial fluorine doped tin oxide (FTO) glass (Pilkington TEC15), as reported in a previous paper (Du Pasquier et al. (2006) Applied Physics Letters 89:253513-1-3). Copper was electrodeposited on ZnO from an aqueous CuSO$_4$ solution. Then, copper film treated in the same boiling solution converted to Cu$_2$O according to the process described below in Example 2. Although Cu$_2$O can be directly electrodeposited, this is usually done at basic pH. This two step method was preferred to avoid dissolving the ZnO layer in basic solution. Then, 7.5 nm transparent gold contacts were sputtered on the Cu$_2$O surface. The EQE value measured with the gold contact was 80% at its peak, which confirms the high values obtained by the gel measurement. Visible photoresponse under AM 1.5 illumination was observed, with open-circuit voltage of 400 mV and short-circuit current of ~35 µA/cm$^2$ (FIG. 12). This result may be attributed to the close band alignment between Cu$_2$O valence band and Au work function, which favors hole extraction from Cu$_2$O without opposing the electric field in the heterojunction.

EXAMPLE 2

Preparation of photoactive cuprous oxide (Cu$_2$O) is achieved via simple solution treatment of copper foils in copper sulfate aqueous solution. XRD indicates that pure Cu$_2$O phase is obtained, and gel electrolyte is used to probe high photocurrent on the film. Zinc oxide layer is deposited via MOCVD or spin coating, and the resulting Cu$_2$O—ZnO heterojunction solar cells are characterized with transparent Au or gallium doped zinc oxide (GZO) top contacts.

Experimental

Cu$_2$O Preparation

Copper foils (0.8 mm thick, 1*1 in$^2$ pieces) were mechanically micro polished, rinsed with methanol and treated for 10 minutes in a boiling aqueous solution of 10 wt. % CuSO$_4$. The foils rapidly turned to a purple color, indicating a conversion of Cu to Cu$_2$O according to the reaction:

$$Cu^0 + Cu^{II}SO_4 + H_2O \rightarrow Cu^{I}_2O + H_2SO_4 \qquad (4)$$

The thickness of Cu$_2$O layer as function of reaction time was measured with a Veeco D150 stylus profilometer (FIG. 13). A maximum thickness of ~600 nm was reached after 10 minutes, and longer reaction times did not lead to thicker films. This is consistent with a chemical passivation process, where the reaction stops when all metallic copper has reacted on the surface.

For comparison, the preparation of Cu$_2$O by oxidation of Cu foils in air at 700, 800 and 900° C. was performed. A mixture of CuO and Cu$_2$O phases was obtained, while the solution reaction led to pure Cu$_2$O phase, as evidenced by their XRD patterns (FIG. 2). Low oxygen contents are necessary to successfully prepare pure Cu$_2$O via thermal oxidation. Thus, the solution reaction presented here is advantageous because it yields pure Cu$_2$O films, and requires considerably less energy than the thermal oxidation.

Preparation of Photovoltaic Devices

Several types of devices have been made using Cu$_2$O substrates prepared by the solution process described above. They were of the types Cu$_2$O/ZnO/GZO, where ZnO layers were deposited using two methods: (i) spin coating using 10 wt. % Zinc acetate in methanol, followed by 350° C. annealing (Santos et al. (2007) Materials Letters 61:3432-3435), or (ii) MOCVD using diethyl zinc (Chen et al. (2006) J. Electron. Mater. 35:1314). The transparent top contacts were either semi-transparent Au (7.5 nm) deposited by sputtering, or Ga-doped zinc oxide (GZO, 500 nm), deposited by MOCVD (Chen et al. (2008) Semicond. Sci. Technol. 23:045004). In the case of ZnO deposited by MOCVD, there is a preferential orientation along the c-axis, and dense arrays of essentially single crystal ZnO nanotips are formed (Chen et al. (2006) Applied Physics Letters 89:253513). The morphology of the GZO layer is polycrystalline with no preferential orientation.

Photovoltaic devices were characterized by external quantum efficiency (EQE) using setup similar as used for photocurrent with gel electrolyte, and I-V in the dark and under AM 1.5 simulated sunlight.

Results

Gel Measurements on Cu$_2$O Films

Photocurrent versus wavelength where measured on Cu$_2$O films using the gel electrolyte and probe described in experimental section.

The photocurrents of Cu$_2$O films prepared either by oxidation at 900° C. in air, or by solution reaction at 90° C. in aqueous CuSO$_4$ are shown on FIG. 14. The results indicate that higher photocurrents are obtained with the solution conversion process, which can be attributed to the higher purity of the Cu$_2$O phase (absence of CuO as evidenced by XRD).

As stated hereinabove, photocurrent stability versus time was observed to greatly improve when using a non-aqueous gel electrolyte. The mechanism described hereinabove was confirmed by the visual evidence of Cu$_2$O dissolution after photocurrent measurement with the aqueous electrolyte, and the fact that dissolution only occurred when the circuit was closed and exposed to light. The photocurrent decay after ~3 hours with the non-aqueous gel is linked with solvent evaporation from the gel, since it was not hermetically sealed.

Photocurrent and EQE Measurement of Cu$_2$O/ZnO Photovoltaic Cells

Effect of ZnO buffer layer—The external quantum efficiency were compared of Cu/Cu$_2$O/ZnO$_{50nm}$/GZO$_{500nm}$ and Cu/Cu$_2$O/GZO$_{500nm}$ where Cu/Cu$_2$O substrates are prepared by the solution conversion and coated with ZnO and GZO grown by MOCVD. The EQE measurements clearly show the beneficial effect of ZnO buffer layer on photocurrent. This is attributed to the formation of an n-p heterojunction which facilitates the separation of electron-hole pairs. An EQE of 9.5% was obtained with a 50 nm ZnO buffer layer (FIG. 15).

Effect of voltage bias on photocurrent of Cu$_2$O/ZnO photovoltaic cells—The dependency of photocurrent versus wavelength was studied at various voltage biases on Cu/Cu$_2$O/ZnO/GZO devices. This is performed automatically with a LabVIEW program which sets the bias on potentiostat and scans the wavelength on monochromator, while recording photocurrent with the Lock-in amplifier. The typical results shown on a 3D plot (FIG. 16) indicate that voltage bias, either positive or negative, is necessary to obtain maximum photocurrent form the devices. The point of zero photocurrent corresponds to the open-circuit voltage, and was very low (<100 mV) in all devices tested. It can be concluded that such curves indicate a poor diode rectification, and low solar power conversion efficiency despite high photocurrent.

Effect of metal contacts on I-V response of Cu$_2$O/ZnO photovoltaic cells—Three configurations of Cu$_2$O/ZnO photovoltaic cells were studied:

1. Cu/Cu$_2$O/ZnO/Au device, where the ZnO layer was spin-coated, and Au top contact was sputtered on ZnO. Such devices had almost no diode rectification, and no visible changes of the I-V curves during illumination. The poor diode rectification may be due to the high work function of Au (5.1 eV), which opposes the built-in electric field at the heterojunction (FIG. 17A).

2. Cu/Cu$_2$O/ZnO/GZO devices where the ZnO and GZO layers are grown by MOCVD (50 and 500 nm respectively). In this case, the diode rectification is improved, but photo response is still difficult to observe on the I-V curve. The improved diode rectification may be to the close conduction band alignment between GZO and ZnO. (FIG. 17B).

3. FTO/ZnOnt/Cu$_2$O/Au, where ZnO was grown by MOCVD on commercial FTO/glass (Pilkington TEC15). Copper was electrodeposited on ZnO from an aqueous CuSO$_4$ solution. Then, copper film treated in the same boiling solution converts to Cu$_2$O. Although Cu$_2$O can be directly electrodeposited, this is usually done at basic pH. This two step method was preferred to avoid dissolving the ZnO layer in basic solution. Then, 7.5 nm transparent gold contacts were sputtered on the Cu$_2$O surface. The devices obtained by this process had best diode rectification, and visible photoresponse under AM 1.5 illumination (FIG. 17C). This result may be attributed to the close band alignment between Cu$_2$O valence band and Au work function, which favors hole extraction from Cu$_2$O without opposing the electric field in the heterojunction.

Thus, a simple solution process for the preparation of pure phase Cu$_2$O has been shown with higher photocurrents than with samples prepared by thermal oxidation. This process is considerably less energy consuming than the thermal oxidation, thus very well suited for photovoltaic production because it reduces energy payback time and lowers greenhouse gases emissions during production. A gel electrolyte and a simple probe were used for photocurrent measurement directly on the Cu$_2$O surface. Much improved photocurrent stability with a non-aqueous gel electrolyte is shown herein, and attribute photocurrent decay to Cu$_2$O dissolution with aqueous gel electrolyte. The solution prepared Cu$_2$O was used to build solid state Cu$_2$O/ZnO photovoltaic devices which demonstrate EQE of 9.5%. The best diode rectification is observed in devices of configuration GZO/ZnO/Cu$_2$O/Au. These results form a solid basis for the use of efficient Cu$_2$O/ZnO solar cells.

A number of publications and patent documents are cited throughout the foregoing specification in order to describe the state of the art to which this invention pertains. The entire disclosure of each of these citations is incorporated by reference herein.

While certain of the preferred embodiments of the present invention have been described and specifically exemplified above, it is not intended that the invention be limited to such embodiments. Various modifications may be made thereto without departing from the scope and spirit of the present invention, as set forth in the following claims.

What is claimed is:

1. A method for measuring an external quantum efficiency of a sample, said method comprising
   a) contacting said sample with an electrolyte gel;
   b) contacting said electrolyte gel with a fiber optics probe, wherein said fiber optics probe comprises a metal terminus, and wherein said fiber optic probe has a spacer at the metal terminus which fixes a distance from said fiber optics probe to said sample;
   c) directing light on said sample through said probe;
   d) measuring a photocurrent caused by step c); and
   e) determining the external quantum efficiency based on a power of the light in step c) and the photocurrent measured in step d).

2. The method of claim 1, wherein said spacer is an electrical insulator.

3. The method of claim 2, wherein said spacer comprises plastic or polytetrafluoroethylene.

4. The method of claim 1, wherein said metal terminus comprises copper.

5. The method of claim 1, wherein said electrolyte gel is non-aqueous.

6. The method of claim 1, wherein said electrolyte gel comprises at least one of CuSO$_4$, Cu, Mn, Fe, Co, Ni, sulfates, acetates, nitrates, and chlorites.

7. The method of claim 5, wherein said electrolyte gel comprises a polar solvent and a polymer.

8. The method of claim 7, wherein said polymer is selected from the group consisting of poly(vinylidene fluoride), poly(vinylidene fluoride-co-hexafluoropropene), poly(acrylonitrile), poly(ethylene oxide), polyimide, and poly(methyl metacrylate).

9. The method of claim 7, wherein said polar solvent is selected from the group consisting of N-methylpyrrolidone, propylene carbonate, methoxypropionitrile, and gamma-butyrolactone.

10. The method of claim 5, wherein said non-aqueous electrolyte gel comprises CuSO$_4$, poly(vinylidene fluoride-co-hexafluoropropene), and N-methylpyrrolidone.

11. The method of claim 1, wherein said light is a chopped monochromatic light beam.

12. The method of claim 1, wherein said photocurrent is amplified.

* * * * *